(12) United States Patent
Minixhofer et al.

(10) Patent No.: US 8,013,450 B2
(45) Date of Patent: Sep. 6, 2011

(54) SEMICONDUCTOR COMPONENT WITH TERMINAL CONTACT SURFACE

(75) Inventors: Rainer Minixhofer, Unterpremstätten (AT); Verena Vescoli, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 12/529,911

(22) PCT Filed: Jan. 21, 2008

(86) PCT No.: PCT/EP2008/050642
§ 371 (c)(1),
(2), (4) Date: Jun. 21, 2010

(87) PCT Pub. No.: WO2008/107216
PCT Pub. Date: Sep. 12, 2008

(65) Prior Publication Data
US 2010/0276811 A1    Nov. 4, 2010

(30) Foreign Application Priority Data
Mar. 7, 2007    (DE) .......... 10 2007 011 126

(51) Int. Cl.
*H01L 23/52* (2006.01)
(52) U.S. Cl. .......................... 257/773; 257/E23.141
(58) Field of Classification Search .............. 257/758, 257/773, 774, E23.062, E23.141
See application file for complete search history.

(56) References Cited

U.S. PATENT DOCUMENTS

| | | | |
|---|---|---|---|
| 6,028,367 A | 2/2000 | Yu | |
| 6,100,573 A | 8/2000 | Lu et al. | |
| 6,313,537 B1 | 11/2001 | Lee et al. | |
| 6,448,650 B1 | 9/2002 | Saran et al. | |
| 6,552,433 B1 | 4/2003 | Chou et al. | |
| 2002/0170742 A1 | 11/2002 | Liaw et al. | |
| 2002/0179991 A1* | 12/2002 | Varrot et al. | 257/459 |
| 2003/0173640 A1* | 9/2003 | Ando et al. | 257/508 |
| 2004/0070086 A1* | 4/2004 | Lee et al. | 257/784 |
| 2009/0283901 A1* | 11/2009 | Ohmi | 257/700 |

FOREIGN PATENT DOCUMENTS

| | | |
|---|---|---|
| EP | 0 100 100 | 2/1984 |
| EP | 0 875 934 | 11/1998 |
| EP | 0 973 198 | 1/2000 |
| GB | 2 406 707 | 4/2005 |

OTHER PUBLICATIONS

H.J. Barth, "Back end of line manufacturing technology—Outlook to 45nm logic node", LEDM2005-Short Course.

K. Maex et al., "Low dielectric constant materials for microelectronics", J. Applied Physics, vol. 93, No. 11, pp. 8793-8841, 2003.

* cited by examiner

*Primary Examiner* — Thomas L Dickey
*Assistant Examiner* — Fazli Erdem
(74) *Attorney, Agent, or Firm* — Cozen O'Connor

(57) ABSTRACT

At least one terminal contact surface (1) is formed on a topmost metal plane (2). Under it, in a secondmost metal plane (3), is a reinforcement region (8), in which the secondmost metal plane (3) is structured within its two-dimensional extent such that a part of the area of the vertical (with respect to the metal plane) projection of the terminal contact surface (1) onto the secondmost metal plane (3) that is occupied by the metal of the secondmost metal plane (3) amounts to at least one third of the area.

10 Claims, 3 Drawing Sheets

SEMICONDUCTOR COMPONENT WITH TERMINAL CONTACT SURFACE

RELATED APPLICATIONS

This is a U.S. national stage of application No. PCT/EP2008/050642, filed on Jan. 21, 2008.

This application claims the priority of German application no. 10 2007 011 126.8 filed Mar. 7, 2007, the entire content of which is hereby incorporated by reference.

FIELD OF THE INVENTION

This invention concerns a semiconductor device with a terminal contact surface in which damage by mechanical stresses in the terminal contact surface is largely avoided.

BACKGROUND OF THE INVENTION

Semiconductor devices are usually provided with a wiring system of a number of metallization planes that are arranged in coplanar fashion one above the other, with an intermetal dielectric being present between the metallization planes. Such a metallization plane is in each case structured into conducting paths, via which individual components of the circuit integrated into the semiconductor device are connected to each other. The intermetal dielectric is usually silicon dioxide, silicon nitride, phosphorus silicate glass (PSG), an organic material with a low relative dielectric constant such as siloxane, or a porous material with a low relative dielectric constant such as SiCOH. Between the conducting paths of the various metallization planes in the intermetal dielectric there are through-contacts, so-called vias, which produce a vertical electrically conducting connection between the metallization planes.

For external electric connections, there is at least one terminal contact surface, a so-called bond pad, on the upper side. Outside the terminal contact surface, the top side can be coated with a suitable passivation layer. In each case, a bond wire is electrically connected to the terminal contact surface, for example soldered, which is also called "bonding." The terminal contact surface can be formed by a stack of electrically conducting layers, which are usually metal. The terminal contact surfaces can be aluminum or an aluminum alloy, since aluminum is very resistant to environmental influences, especially corrosion. Likewise, aluminum or copper, but also other metals, can be used for the wiring. Before the bonding, the functioning of the semiconductor device is tested. For this test, probes are brought into contact with the terminal contact surfaces. Since these test probes are made of a hard metal such as tungsten, a mechanical stress arises when a test probe contacts a terminal contact surface and deforms the terminal contact surface. In particular, it is possible in this case for an upper aluminum layer of the terminal contact surface to be damaged so that a copper layer lying under it becomes separated over some of its area, and in this way is exposed to the corrosive effects of the environment. In the bonding process, a significant mechanical strain is produced through the use of ultrasound and high temperature. The mechanical strain advances into deeper layers and can give rise to cracks there, especially in the intermetal dielectric. Then, short circuits between the conducting paths can arise at the affected sites. If active components are situated under the terminal contact surfaces in the semiconductor substrate, in an extreme case, the damage to the circuit components can also take place in the bonding process.

US 2004/0070086 A1 describes a method for preparation of bond pads over elements in which a bond pad is arranged over a passivation layer that is in contact with a terminal surface. For this, an adhesive layer of metal is first applied to the passivation layer and the terminal surface. A minimum 1-μm-thick gold layer is electrolytically deposited on top of that as bond pad.

GB 2 406 707 A describes a reinforcement for bond pads that is formed in combination both with the bond pad and also with an underlying additional metal layer made up of a metal that is different from that of the bond pad.

U.S. Pat. No. 6,552,433 B1 describes a wiring in which the through-contacts in the layers of the intermetal dielectric are parallel trenches, in each case filled with metal. The trenches of the different layers cross, so that a network structure is formed, which serves for mechanical reinforcement and to protect the active components arranged under a bond pad.

Descriptions of mechanical reinforcements of bond pads can also be taken from U.S. Pat. Nos. 6,313,537 B1; 6,100,573; 6,448,650 B1; US 2002/0179991 A1 and US 2002/0170742. U.S. Pat. No. 6,028,367 describes bond pads with rings for heat dissipation.

SUMMARY OF THE INVENTION

One object of the invention is to specify how damage by mechanical stresses can be better avoided in the case of a semiconductor device with a terminal contact surface.

This and other objects are attained in accordance with one aspect of the present invention directed to a semiconductor device with a terminal contact surface, comprising metal planes with intermetal dielectric. The metal planes include at least one topmost metal plane and a secondmost metal plane. At least one terminal contact surface is formed on the topmost metal plane, and the secondmost metal plane is structured such that at least one-third of an area obtained by a projection of the terminal contact surface into the secondmost metal plane, the projection being perpendicular with respect to the metal plane, is occupied by the metal of the secondmost metal plane. At least a portion of said area allows a gapless cover with affine triangles such that an affine mapping that maps one of the triangles onto another triangle will map the structure of the secondmost metal plane in the former triangle into the structure of the secondmost metal plane in the latter triangle.

Another aspect of the present invention is directed to a semiconductor device with a terminal contact surface, comprising metal planes with intermetal dielectric. The metal planes include at least one topmost metal plane and a secondmost metal plane. At least one terminal contact surface is formed on the topmost metal plane, the secondmost metal plane being structured such that at least one-third of an area obtained by a projection of the terminal contact surface into the secondmost metal plane, the projection being perpendicular with respect to the metal plane, is occupied by the metal of the secondmost metal plane. The secondmost metal plane is structured, in at least a portion of said area, into one or more strips having segments that are arranged parallel to one another, at least one of the strips forming a conductive track with boustrophedonic change of direction.

In embodiments of the semiconductor device with a terminal contact surface, there are metal planes with an intermetal dielectric, and at least one terminal contact surface is formed in or on the topmost metal plane. The metal plane second from the top is structured within its two-dimensional extent such that a part of the area of a projection of the terminal contact surface perpendicular to the metal plane, said part occupied by the metal of the secondmost metal plane, amounts to at least a third of said area. The metal plane here is always understood to mean a layer of the wiring structure of the semiconductor device occupied by a metallization plane. Therefore, because of the structure that is present, the metal does not occupy the entire area of the metal plane, but rather, in each case only a part that forms the conducting paths of the wiring or the like. In a portion of the plane of the secondmost metal plane, the portion lying opposite the terminal contact surface, vertically with respect to the metal planes, the metal of the secondmost metal plane is structured such that at least one-third of said portion is occupied by the metal. Instead of at least one-third, it is also possible for at least half of said portion to be occupied by the metal. In this way, in the secondmost metal plane under the terminal contact surface, a mechanical stabilization of the entire layer structure is produced by this relatively dense metal structure.

In embodiments, the structure of the metal in the reinforcement region of the secondmost metal plane is formed in a triangular pattern. Instead of this, the structure can have strips that are arranged in wavy lines or in a spiral shape. In particular, the structure can have translation symmetry or point symmetry. Designs and additional embodiments of the semiconductor device result from the dependent claims.

DETAILED DESCRIPTION OF THE DRAWINGS

Figure 1:
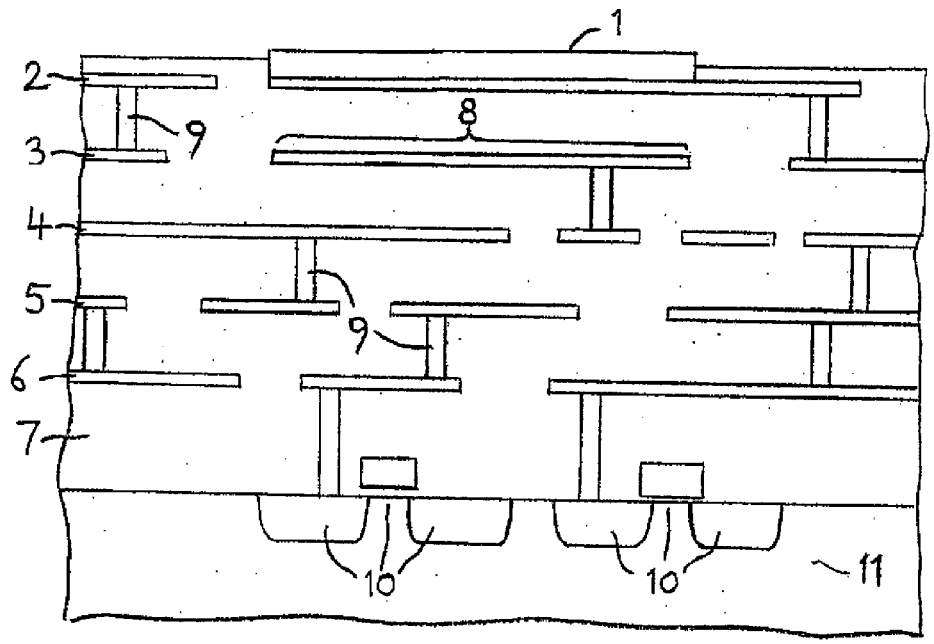
FIG. 1 shows a cross section through an embodiment of the semiconductor device.

FIG. 1 shows an embodiment of a semiconductor device with a terminal contact surface (1) in cross section. The terminal contact surface (1) in this example is situated on a bond pad formed of a sequence of layers. The terminal contact surface (1) is arranged on a topmost metal plane (2). In this example, a secondmost metal plane (3) and additional metal planes are present. The metal planes M2 (4), M1 (5) and M0 (6) are shown in FIG. 1 as examples of the additional metal planes. However, there can be any number of metal planes that form the wiring, and the number can deviate from the number shown here. Between the metal planes there is an intermetal dielectric (7), which can be any of the materials that are conventional for intermetal dielectrics, in particular one of the materials mentioned above.

In the secondmost metal plane (3) under the terminal contact surface (1), there is a reinforcement region (8), at least roughly opposite the terminal contact surface (1) in the vertical direction with regard to the metal plane, or, in other words, at least roughly in a projection of the terminal contact surface (1) to the secondmost metal plane (3) that is perpendicular to the metal plane. In the reinforcement region (8), the metal of the secondmost metal plane (3) occupies at least a third of the area of the reinforcement region (8). The metal of the secondmost metal plane (3) can, however, also be structured to be thicker in the reinforcement region (8) and in this way, can occupy in particular at least half of the area of the reinforcement region (8). The indicated part in each case is given with reference to the two-dimensional extent of the secondmost metal plane (3) and assumes that the structured conducting paths in the metal planes have at least essentially overall this same thickness. However, a vertical structuring of the secondmost metal plane (3) can additionally be provided.

Between the metal planes there are through-contacts (9) (vias), which are intended for a vertical electrically conductive connection between the metal planes. In FIG. 1, transistor structures (10) are indicated in substrate (11) in order to clarify that, in the case of this embodiment, active components can also be arranged under the terminal contact surface (1). In the example of FIG. 1, the two-dimensional extent of the reinforcement region (8) has about the same dimensions as the terminal contact surface (1). The reinforcement region (8) can, however, also be made larger or smaller than the terminal contact surface (1).

The reinforcement region (8) in the secondmost metal plane (3) reduces the transfer of mechanical stress arising in the terminal contact surface (1) from the topmost metal plane (2) into the underlying metal planes (4), (5) and (6) and into the intermetal dielectric (7). The structure of the metal plane in the reinforcement region (8) is therefore specified such that a pressure exerted on the terminal contact surface (1) from above, i.e., from the side turned away from the secondmost metal plane (3), only causes deformation of the reinforcement region (8) that is less than the deformation of the terminal contact surface (1) so that the effect on the lower lying metal planes is reduced and the mechanical stress that arises is accepted by the reinforcement region (8) and at least partially attenuated by it. In this way, the development of cracks is prevented, especially in the intermetal dielectric (7). The mechanical stress in particular is not transferred from the terminal contact surface (1) into the components that are present in substrate (11).

In embodiments, it can in particular be intended to utilize the metal of the reinforcement region (8) for the wiring within the secondmost metal plane (3) as well. In FIG. 1, this is indicated by the through-contact which connects reinforcement region (8) with a part of metal plane M2 (4).

Figure 2:
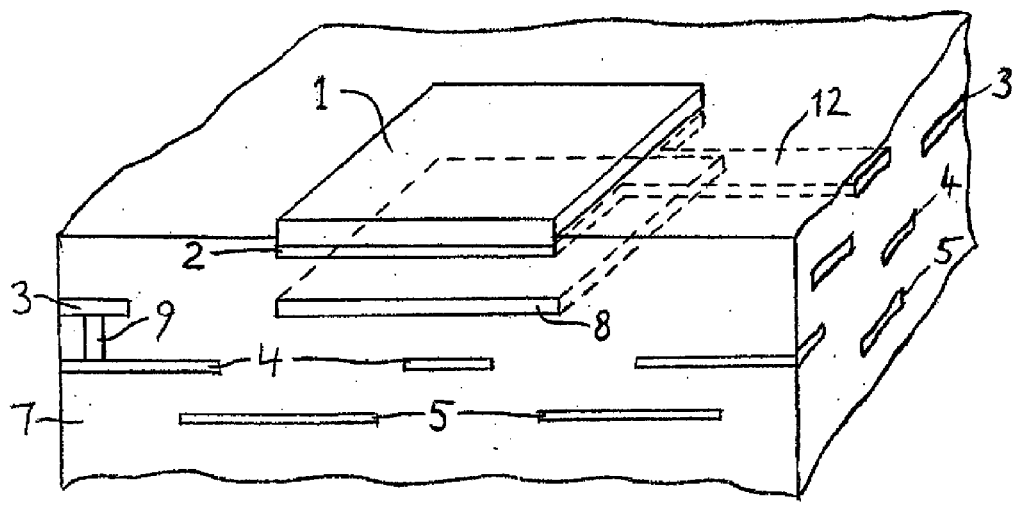
FIG. 2 shows a schematic perspective view of another embodiment.

FIG. 2 shows another embodiment in a schematic perspective view, in which the front sectional surface is flat and corresponds approximately to a cross section as in FIG. 1. In this example, the terminal contact surface (1), corresponding to the drawing in FIG. 1, is situated a little higher than the remaining top side of the semiconductor element. The bond pad therefore is made to be a little elevated. However, in other embodiments, it can also be intended that the remaining part of the top side be a little higher and the terminal contact surface (1) sunk a little in a topmost passivation layer or such like. Instead of this, it is also possible for the semiconductor element to have an absolutely flat top surface. The ratio of the thickness of the metal planes to the thickness of the planes of intermetal dielectric material arranged between them can vary; the representation in FIG. 2 is not true to scale. However, FIG. 2 illustrates the relative arrangement of the terminal contact surface (1) formed on the topmost metal plane (2) and the reinforcement region (8) arranged under it in the secondmost metal plane (3).

If there is not a direct electrically conductive connection via a through-contact between the terminal contact surface (1) and the reinforcement region (8) in the embodiment, a terminal conductive path (12) for the terminal contact surface (1) can be provided within the secondmost metal plane (2). The electrical connection of the terminal contact surface (1) to functional elements or components of the semiconductor device can thus be provided via the terminal conductive path (12) lateral to the terminal contact surface (1) and via through-contacts arranged there to underlying metal planes. In this example, there is only the intermetal dielectric (7) without through-contacts between the terminal contact surface (1) and the reinforcement region (8).

The other reference numbers in FIG. 2 indicate the same elements as in FIG. 1. The structure of the secondmost metal plane (3) in the reinforcement region (8) is not shown in FIG. 2, for the sake of clarity. Embodiments are explained below by means of the additional figures.

Figure 3:
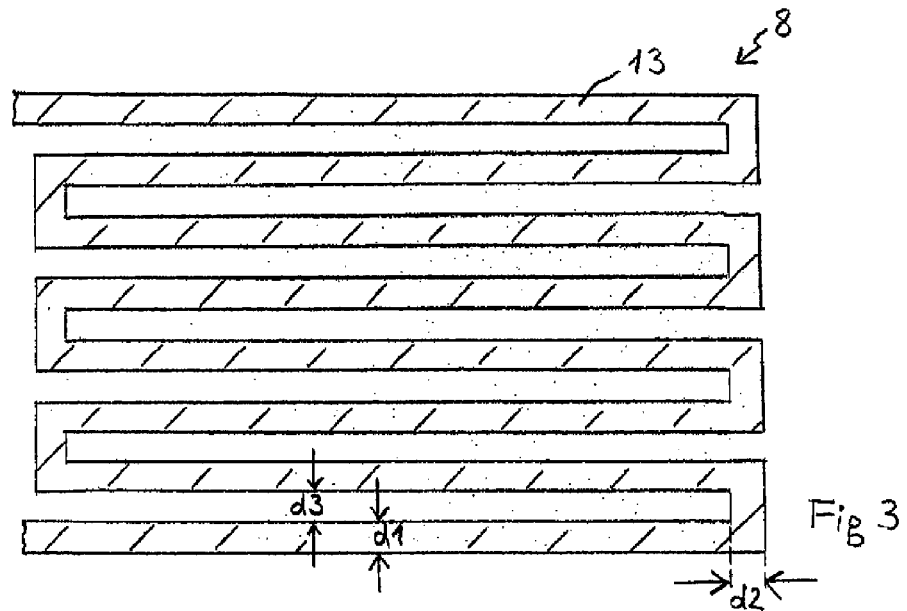
FIG. 3 shows an example of a structure of the reinforcement region in the secondmost metal plane.

FIG. 3 shows an embodiment of a structure of the secondmost metal plane (3) in the reinforcement region (8). The regions of the surface occupied by the metal are shaded in FIG. 3. In this embodiment, the metal in the reinforcement region (8) is structured into strips (13). The strips (13) are arranged segment-wise parallel to each other and very closely together. The strips (13) can form a coherent conductive path, in particular in embodiments in which the metal within the reinforcement region (8) is also a component of the wiring. In the embodiment of FIG. 3, the continuous strip (13) is laid out back and forth so that it has a boustrophedonic change of direction. Instead of this, the strips (13) can form meander-like strips, for example, of the kind of an ornamental meander band, or can be wound in spirals. In the example shown in FIG. 3, the metal takes up about half of the area of the reinforcement region (8). Width d1 of strip (13) in the parallel segments, width d2 of strip (13) in the turns in which the change of direction takes place, and width d3 of the intermediate spaces between adjacent segments of strip (13) are of the same size in this embodiment. The density of the structure of the metal that is sufficient for the function of mechanical reinforcement is also provided with other embodiments of strip (13). Strip (13) can be arranged such that the individual segments lie as close as possible to each other and in this way, can fill up the reinforcement region (8) to at least a third, or even to a greater fraction.

Figure 4:
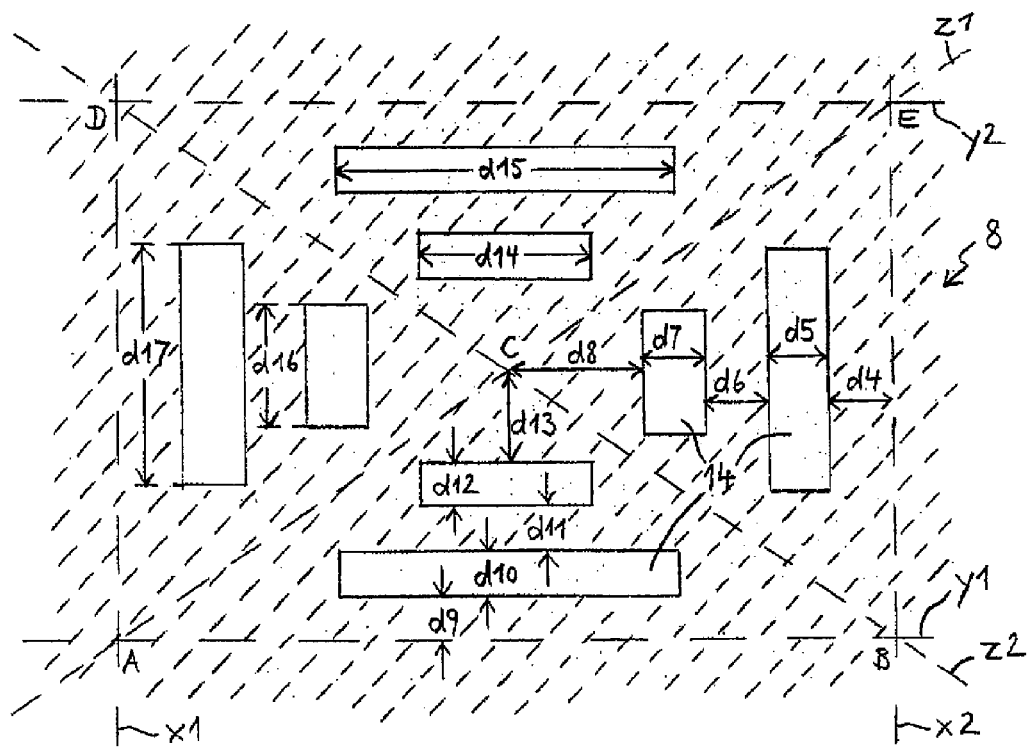
FIG. 4 shows another example of the structure of the reinforcement region.

FIG. 4 shows another example of the structure of the metal in the reinforcement region (8). The region of the surface occupied by the metal is also shaded in FIG. 4. In this example, there is a plurality of openings (14) in the secondmost metal plane (3) within the reinforcement region. In the example in FIG. 4, the openings (14) are rectangular, but they can also have other shapes. In the embodiment, the dimensions d4, d5, d6, and d7, indicated in FIG. 4 are the same and, likewise, dimensions d9, d10, d11 and d12 are the same, while dimension d8 is twice the dimension d7, and dimension d13 is twice the dimension d12.

Only a segment of the area of the reinforcement region (8) is shown in FIG. 4. The openings (14) are arranged in a triangular pattern. The four triangles with corners ABC, BEC, EDC and DAC together form a rectangle ABED. The area of the reinforcement region (8) can be divided into a large number of such rectangles by a family of parallel lines x1, x2, . . . , and by a family of parallel lines y1, y2, . . . , and these rectangles can each be divided into the indicated triangles by the diagonals z1, z2, . . . . The arrangement of the openings (14) is periodic and corresponds to the sequence of lines x1, x2, . . . or the sequence of lines y1, y2, . . . , and in each case has local mirror symmetry, and in each case it has local point symmetry to the intersection C of the diagonals z1, z2, . . . . The triangles selected in this way form a gapless parquet pattern, i.e., they cover the area without leaving intermediate spaces open or overlapping. In embodiments, the triangles underlying the structure are pairwise affine. The areas of the triangles therefore can be mapped onto each other by a linear map plus translation. In embodiments, it can additionally be provided that in the case of an affine mapping that causes two of the triangles to cover, the openings (14) in the relevant triangles are likewise mapped onto each other. This is also indicated in FIG. 4 by the fact that the ratios of dimensions d14 and d15 to the length of segment DE are the same as the ratio of dimension d16 or d17 to the length of segment AD. The triangular basic pattern of the structure can also be formed by equilateral triangles or can develop from the pattern of FIG. 4 through stretching, compression or shearing.

Figure 5:
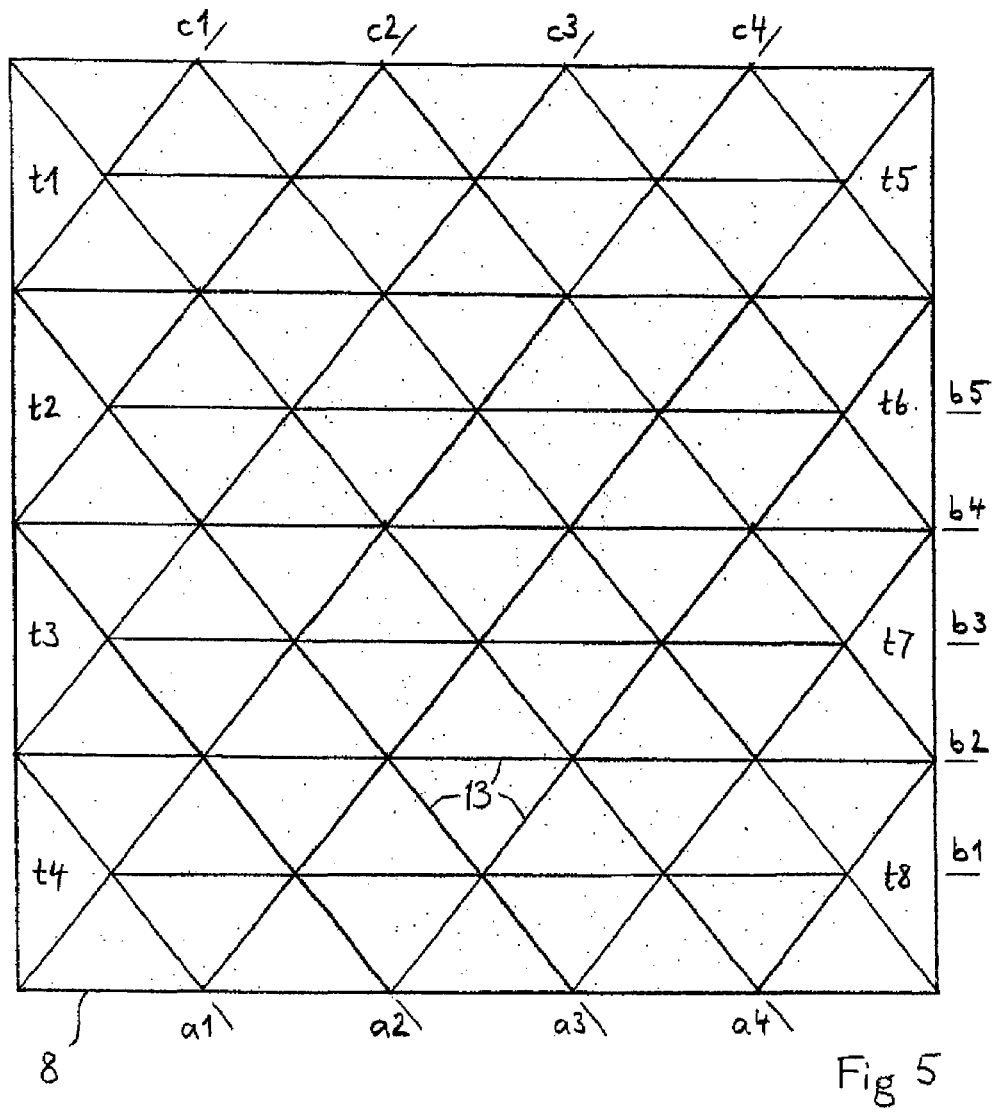
FIG. 5 shows a schematic diagram of yet another example of the structure of the reinforcement region.

FIG. 5 shows another embodiment, in which the metal strips (13) that are in the reinforcement region (8) are represented schematically by straight lines without lateral extension. In this embodiment, the structure is also based on a triangular pattern. The lines a1, a2, . . . , b1, b2, . . . , c1, c2, . . . are, for example, the center lines of the metal strips (13). The area of the reinforcement region (8) in this way can be represented in a parquet pattern by triangles without gaps. The triangles t1, t2, t3, t4, t5, t6, t7 and t8 that are arranged at the edges of the reinforcement region (8) are congruent in this example. The other triangles are all congruent but have a shape that is different from that of t1. Since the reinforcement region (8) does not have to be bounded by straight lines, it is also possible for a gapless parquet pattern to be present with, for example, equilateral triangles. In the embodiment shown in FIG. 5, there is a family of parallel lines, for example, c1, c2, c3, c4, . . . , such that any triangle of the parquet pattern has a corner point that lies on a straight line in this family and has two corner points that lie on straight lines of this family that are adjacent to the first line.

The use of a basic pattern that is based on triangles has the advantage of forming a triangular structure of the metal that best satisfies the statistical requirements and provides tortional stiffness and mechanical stability of the reinforcement region (8) that are as high as possible.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor device with a terminal contact surface, comprising:
    metal planes with intermetal dielectric, comprising at least one topmost metal plane and a secondmost metal plane;
    at least one terminal contact surface formed on the topmost metal plane; and
    the secondmost metal plane being structured such that at least one-third of an area obtained by a projection of the terminal contact surface into the secondmost metal plane, the projection being perpendicular with respect to the metal plane, is occupied by the metal of the secondmost metal plane, and at least a portion of said area allows a gapless cover with affine triangles such that an affine mapping that maps one of the triangles onto another triangle will map the structure of the secondmost metal plane in the former triangle into the structure of the secondmost metal plane in the latter triangle.

2. The semiconductor device of claim 1, wherein
    at least a portion of said area allows a gapless cover with isosceles triangles such that an affine mapping that maps one of the triangles onto another triangle will map the structure of the secondmost metal plane in the former triangle into the structure of the secondmost metal plane in the latter triangle.

3. The semiconductor device of claim 1, wherein
    at least a portion of said area allows a gapless cover with equilateral triangles such that an affine mapping that maps one of the triangles onto another triangle will map the structure of the secondmost metal plane in the former triangle into the structure of the secondmost metal plane in the latter triangle.

4. The semiconductor device of claim 1, wherein
at least a portion of said area allows a gapless cover with congruent triangles such that an affine mapping that maps one of the triangles onto another triangle will map the structure of the secondmost metal plane in the former triangle into the structure of the secondmost metal plane in the latter triangle.

5. The semiconductor device according to claim 4, further comprising:
at least one family of parallel straight lines so that each triangle of the cover has a vertex that lies on one of the straight lines and has two vertices that lie on a straight line adjacent to said straight line.

6. The semiconductor device according to claim 1, further comprising:
at least one family of parallel straight lines so that each triangle of the cover has a vertex that lies on one of the straight lines and has two vertices that lie on a straight line adjacent to said straight line.

7. The semiconductor device according to claim 2, further comprising:
at least one family of parallel straight lines so that each triangle of the cover has a vertex that lies on one of the straight lines and has two vertices that lie on a straight line adjacent to said straight line.

8. The semiconductor device according to claim 3, further comprising:
at least one family of parallel straight lines so that each triangle of the cover has a vertex that lies on one of the straight lines and has two vertices that lie on a straight line adjacent to said straight line.

9. The semiconductor device of claim 1, wherein
the secondmost metal plane is periodically structured in a triangular pattern within its two-dimensional extent, at least in an area obtained by a projection of the terminal contact surface into the secondmost metal plane, the projection being perpendicular with respect to the metal plane.

10. A semiconductor device with a terminal contact surface, comprising:
metal planes with intermetal dielectric, comprising at least one topmost metal plane and a secondmost metal plane;
at least one terminal contact surface formed on the topmost metal plane;
the secondmost metal plane being structured such that at least one-third of an area obtained by a projection of the terminal contact surface into the secondmost metal plane, the projection being perpendicular with respect to the metal plane, is occupied by the metal of the secondmost metal plane; and
the secondmost metal plane being structured, in at least a portion of said area, into one or more strips having segments that are arranged parallel to one another, at least one of the strips forming a conductive track with boustrophedonic change of direction.

\* \* \* \* \*